(12) United States Patent
Hashimoto et al.

(10) Patent No.: US 11,406,048 B2
(45) Date of Patent: Aug. 2, 2022

(54) BASE STATION AND DEVICE COOLING METHOD

(71) Applicant: FUJITSU LIMITED, Kawasaki (JP)

(72) Inventors: Tsubasa Hashimoto, Kita (JP); Kazuhiro Iino, Yokohama (JP); Seiichiro Sato, Inagi (JP); Takashi Shirakami, Kawasaki (JP); Hideaki Matsumoto, Yokohama (JP); Takao Tomiyama, Tachikawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/104,942

(22) Filed: Nov. 25, 2020

(65) Prior Publication Data
US 2021/0185860 A1    Jun. 17, 2021

(30) Foreign Application Priority Data

Dec. 11, 2019   (JP) .............................. JP2019-223474

(51) Int. Cl.
*H05K 7/20* (2006.01)
*H04W 88/08* (2009.01)

(52) U.S. Cl.
CPC ..... *H05K 7/20781* (2013.01); *H05K 7/20145* (2013.01); *H05K 7/20254* (2013.01); *H05K 7/20272* (2013.01); *H05K 7/20718* (2013.01); *H04W 88/08* (2013.01)

(58) Field of Classification Search
None
See application file for complete search history.

(56) References Cited

U.S. PATENT DOCUMENTS

| 7,272,945 | B2 * | 9/2007 | Bash .......................... G06F 1/20 165/247 |
| 2008/0037227 | A1 | 2/2008 | Fujiwara |
| 2009/0168331 | A1 | 7/2009 | Fujiwara |
| 2015/0181769 | A1 * | 6/2015 | Oki .................... H05K 7/20827 165/121 |
| 2019/0037729 | A1 * | 1/2019 | Jochim ............. H05K 7/20745 |
| 2019/0141861 | A1 * | 5/2019 | Shedd ..................... F28F 13/02 |
| 2019/0335626 | A1 * | 10/2019 | Shelnutt ............ H05K 7/20745 |
| 2019/0354220 | A1 * | 11/2019 | Ribbich ................ G06F 1/1601 |

FOREIGN PATENT DOCUMENTS

| JP | 09-020387 A | 1/1997 |
| JP | 10-056848 A | 3/1998 |
| JP | 2002-264851 A | 9/2002 |
| JP | 2005-228216 A | 8/2005 |
| JP | 2007-310716 A | 11/2007 |

* cited by examiner

*Primary Examiner* — Courtney L Smith
(74) *Attorney, Agent, or Firm* — ArentFox Schiff LLP

(57) ABSTRACT

A base station includes a first area and a second area that are obtained by partitioning closed space by a partition wall. The first area includes a first device that controls communication and a liquid cooling device that sends a cooled liquid refrigerant to the first device. The second area includes a radiator that cools a liquid refrigerant by performing heat exchange with air, that supplies the cooled liquid refrigerant to the liquid cooling device, and that discharges the air used for heat exchange into the second area, and includes a second device that radiates heat by using the air discharged from the radiator and that performs a wireless process in accordance with control performed by the first device.

6 Claims, 5 Drawing Sheets

BASE STATION AND DEVICE COOLING METHOD

CROSS-REFERENCE TO RELATED APPLICATION

This application is based upon and claims the benefit of priority of the prior Japanese Patent Application No. 2019-223474, filed on Dec. 11, 2019, the entire contents of which are incorporated herein by reference.

FIELD

The embodiment discussed herein is related to a base station and a device cooling method.

BACKGROUND

In recent years, when a communication base station is stopped at the time of, for example, disaster or when an increase in sudden communication traffic is expected due to, for example, an event or the like, there may sometimes be a case in which a set of communication relay device is mounted on a moving vehicle and is temporarily set up as a mobile base station. For example, such a mobile base station has, as on-board devices, a wireless device that performs a wireless process on signals, a wireless control device that performs a baseband process on the signals, and a server device that controls the wireless control device.

Because these devices generate heat, in a vehicle cabin of a vehicle functioning as the mobile base station, for example, a cooling device having an air cooling system, such as an air conditioner, is set up and various devices constituting the base station are cooled.

Patent Document 1: Japanese Laid-open Patent Publication No. 2005-228216
Patent Document 2: Japanese Laid-open Patent Publication No. 2007-310716
Patent Document 3: Japanese Laid-open Patent Publication No. 10-56848
Patent Document 4: Japanese Laid-open Patent Publication No. 9-20387
Patent Document 5: Japanese Laid-open Patent Publication No. 2002-264851

However, there is a problem in that the cooling capacity of the air conditioner has a certain limitation and various devices are not sufficiently cooled. Namely, a plurality of devices that generate heat are arranged in the vehicle cabin of the mobile base station; however, there is a limit to the size and the capacity of the air conditioner that can be mounted in the vehicle cabin. Accordingly, there may be a risk of failure or the like occurring in the devices due to, for example, insufficient cooling of the wireless control device, the server device, and the like. In addition, when the devices are cooled by increasing an output of the air conditioner, electrical power consumed by the air conditioner is increased and thus the electrical energy that can be supplied to the wireless control device, the server device, and the like is decreased. Consequently, the hours of operation as the mobile base station are shortened.

In addition, because the wireless control device, the server device, and the like are not assumed to be used in an outdoor environment, it is difficult to cool the devices by, for example, introducing outside air into the vehicle cabin of the mobile base station. Namely, if dust or moisture enters the vehicle cabin, precision apparatuses, such as the wireless control device and the server device, can be damaged.

Furthermore, these problems do not occur only in the mobile base station but similarly occur in a fixed base station in which, for example, the wireless device, the wireless control device, and the server device are mounted on a single container.

SUMMARY

According to an aspect of an embodiment, a base station includes a first area and a second area that are obtained by partitioning closed space by a partition wall. The first area includes a first device that controls communication and a liquid cooling device that sends a cooled liquid refrigerant to the first device. The second area includes a radiator that cools a liquid refrigerant by performing heat exchange with air, that supplies the cooled liquid refrigerant to the liquid cooling device, and that discharges the air used for heat exchange into the second area, and includes a second device that radiates heat by using the air discharged from the radiator and that performs a wireless process in accordance with control performed by the first device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Furthermore, the present invention is not limited to the embodiments.

Figure 1:
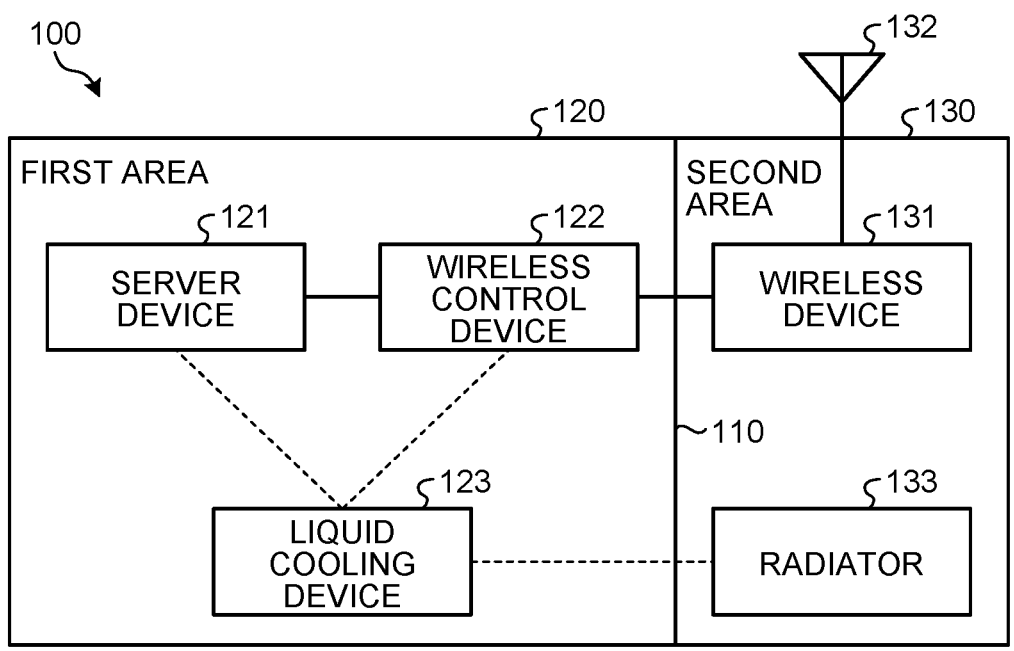
FIG. 1 is a block diagram illustrating a configuration of a base station according to an embodiment.

FIG. 1 is a block diagram illustrating a configuration of a base station 100 according to an embodiment. The base station 100 is constituted by arranging, for example, a plurality of devices in closed space, such as a vehicle cabin, a container, and the like, and at least one of the devices is cooled by a liquid cooling system. In FIG. 1, a connection between devices performed by electricity or light is indicated by the solid line and a moving route of a refrigerant used to cool the devices is indicated by the broken line.

The base station 100 includes a first area 120 and a second area 130 that are formed by partitioning closed space by a partition wall 110.

The first area 120 is an area for arranging devices, such as a server device 121, a wireless control device 122, and the like, and is space in which airtightness is maintained at a certain level by the partition wall 110. The server device 121 and the wireless control device 122 arranged in the first area 120 are the devices that are assumed to be mainly used in an indoor environment. In a description below, these devices are sometimes collectively referred to as "indoor devices".

The server device 121 controls the wireless control device 122 or the like arranged in the first area 120. The server device 121 generates heat due to consuming electrical power during operation but is cooled by the liquid cooling system. Namely, a cooled liquid refrigerant is supplied from a liquid cooling device 123 to the server device 121, and then substrates or the like included in the server device 121 are cooled. Then, the refrigerant that has absorbed heat in the server device 121 is returned to the liquid cooling device 123.

The wireless control device 122 performs a baseband process on signals in accordance with control received from the server device 121. Specifically, the wireless control device 122 encodes and modulations transmission signals, demodulates and decodes reception signals, and the like. Namely, the wireless control device 122 functions as, for example, a centralized baseband unit (CBBU) or a central unit (CU). The wireless control device 122 generates heat due to consuming electrical power during operation but is cooled by the liquid cooling system. Namely, a cooled liquid refrigerant is supplied from the liquid cooling device 123 to the wireless control device 122, and then substrates or the like included in the wireless control device 122 are cooled. Then, the refrigerant that has absorbed heat in the wireless control device 122 is returned to the liquid cooling device 123.

In this way, the indoor devices arranged in the first area 120 are cooled by the liquid refrigerant supplied from the liquid cooling device 123 and are more efficiently cooled when compared with a case in which, for example, the indoor devices are cooled by the cooling device having an air cooling system, such as an air conditioner.

The liquid cooling device 123 supplies the liquid refrigerant to the server device 121 and the wireless control device 122 arranged in the first area 120. Furthermore, the liquid cooling device 123 collects the refrigerant that has absorbed heat in the server device 121 and the wireless control device 122 and again cools the refrigerant by performing heat exchange. Then, the liquid cooling device 123 supplies the re-cooled refrigerant to the server device 121 and the wireless control device 122.

When the liquid cooling device 123 cools the refrigerant collected from the indoor devices, the liquid cooling device 123 performs heat exchange with the refrigerant supplied from a radiator 133. In a description below, the refrigerant supplied from the radiator 133 to the liquid cooling device 123 is referred to as a "primary refrigerant" and the refrigerant supplied from the liquid cooling device 123 to the indoor device is referred to as a "secondary refrigerant". Both of the primary refrigerant and the secondary refrigerant are liquid and, for example, water or the like can be used as the primary refrigerant and the secondary refrigerant. The liquid cooling device 123 cools the secondary refrigerant collected from the indoor devices by performing heat exchange between the primary refrigerant and the secondary refrigerant.

The second area 130 is an area for arranging a wireless device 131 and the radiator 133 and is space in which outside air is allowed to be introduced as compared to the first area 120. The wireless device 131 arranged in the second area 130 is a device that is assumed to be arranged close to an antenna 132 that is set up outdoors.

The wireless device 131 is connected to the wireless control device 122 arranged in the first area by, for example, an optical cable and performs a wireless process on signals. Specifically, the wireless device 131 acquires a transmission signal from the wireless control device 122, performs a predetermined wireless transmission process on the signals, and transmits the signals from the antenna 132. Namely, the wireless device 131 functions as, for example, a remote radio head (RRH) or a distributed unit (DU). Furthermore, the wireless device 131 receives signals from the antenna 132, performs a predetermined wireless reception process on the reception signals, and transmits the signals to the wireless control device 122. An amount of heat generated in the wireless device 131 is smaller than that in the server device 121 and the wireless control device 122, and thus a problem due to generated heat does not occur unless the wireless device 131 is used in a windless environment.

The radiator 133 collects the primary refrigerant from the liquid cooling device 123 and cools the primary refrigerant by performing heat exchange with air. Then, the radiator 133 supplies the cooled primary refrigerant to the liquid cooling device 123. The radiator 133 has a fan (not illustrated) in order to cool the primary refrigerant collected from the liquid cooling device 123 by performing heat exchange with air and forms a flow of air by the fan. Consequently, the radiator 133 is arranged at the position in which exhaust air by the fan flows toward the wireless device 131, and sends the air to the wireless device 131. The wireless device 131 is sufficiently cooled by the air sent from the radiator 133.

Figure 2:
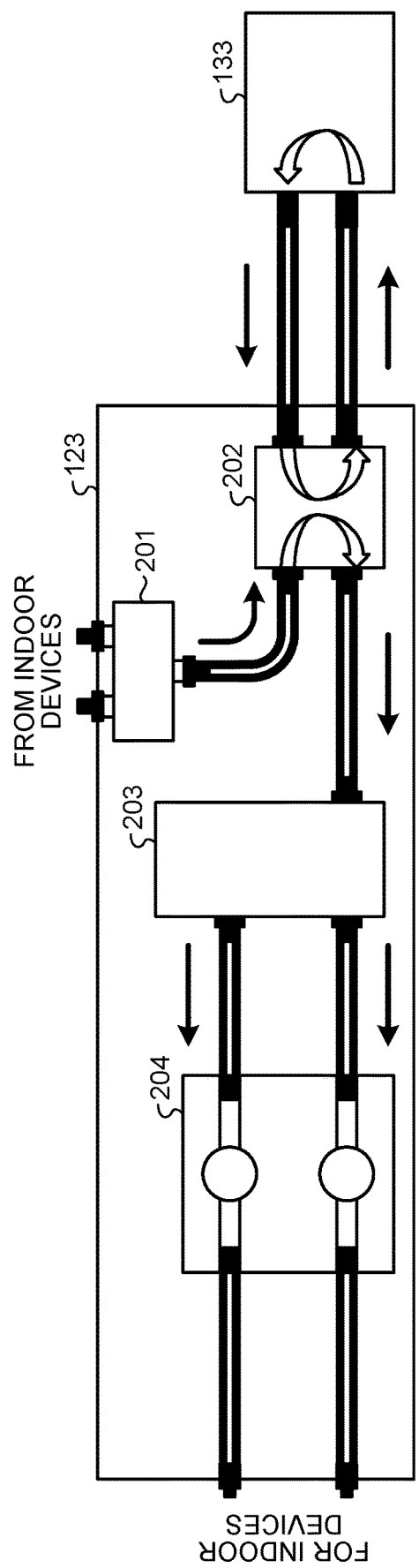
FIG. 2 is a diagram illustrating a configuration example of a liquid cooling device.

FIG. 2 is a diagram illustrating a configuration example of the liquid cooling device 123. The liquid cooling device 123 illustrated in FIG. 2 has a collection tank 201, a heat exchanger 202, a distribution tank 203, and a pump unit 204. The collection tank 201, the heat exchanger 202, the distribution tank 203, and the pump unit 204 are connected by hoses serving as channels of the secondary refrigerant. Furthermore, the heat exchanger 202 is connected to the radiator 133 by hoses serving as channels of the primary refrigerant. In FIG. 2, the direction in which the primary refrigerant or the secondary refrigerant flows is indicated by the black arrow.

The collection tank 201 collects the secondary refrigerant that has been used to cool the indoor devices, such as the server device 121 and the wireless control device 122, and temporarily retains the secondary refrigerant. Namely, the collection tank 201 collects the secondary refrigerant heated by absorbing heat in the indoor devices. Then, the collection tank 201 sends the retained secondary refrigerant to the heat exchanger 202 at a predetermined speed.

The heat exchanger 202 performs heat exchange between the secondary refrigerant sent from the collection tank 201 and the primary refrigerant supplied from the radiator 133, and then cools the secondary refrigerant. The heat exchanger 202 sends the cooled secondary refrigerant to the distribution tank 203 and returns the primary refrigerant used to cool the secondary refrigerant to the radiator 133.

The distribution tank 203 temporarily retains the cooled secondary refrigerant and distributes the secondary refrigerant to each of the indoor devices. Specifically, the distribution tank 203 sends the retained secondary refrigerant to the pump unit 204 associated with each of the server device 121 and the wireless control device 122.

The pump unit 204 includes a pump associated with each of the indoor devices and supplies the secondary refrigerant to each of the indoor devices by the pumps. Namely, the pump unit 204 supplies the cooled secondary refrigerant to each of the server device 121 and the wireless control device 122. The pumps included in the pump unit 204 are, for example, electrically controlled and are capable of adjusting an amount of the secondary refrigerant that is to be supplied to each of the indoor devices.

In this way, in the liquid cooling device 123, heat exchange between the primary refrigerant and the secondary refrigerant is performed by the heat exchanger 202, and then the secondary refrigerant supplied to the indoor devices is cooled. Namely, because the secondary refrigerant supplied to the indoor devices is cooled by heat exchange with the primary refrigerant in the liquid cooling device 123, the secondary refrigerant does not circulate the second area 130 in which outside air is introduced; therefore, it is possible to prevent impurities from mixing with the secondary refrigerant.

Figure 3:
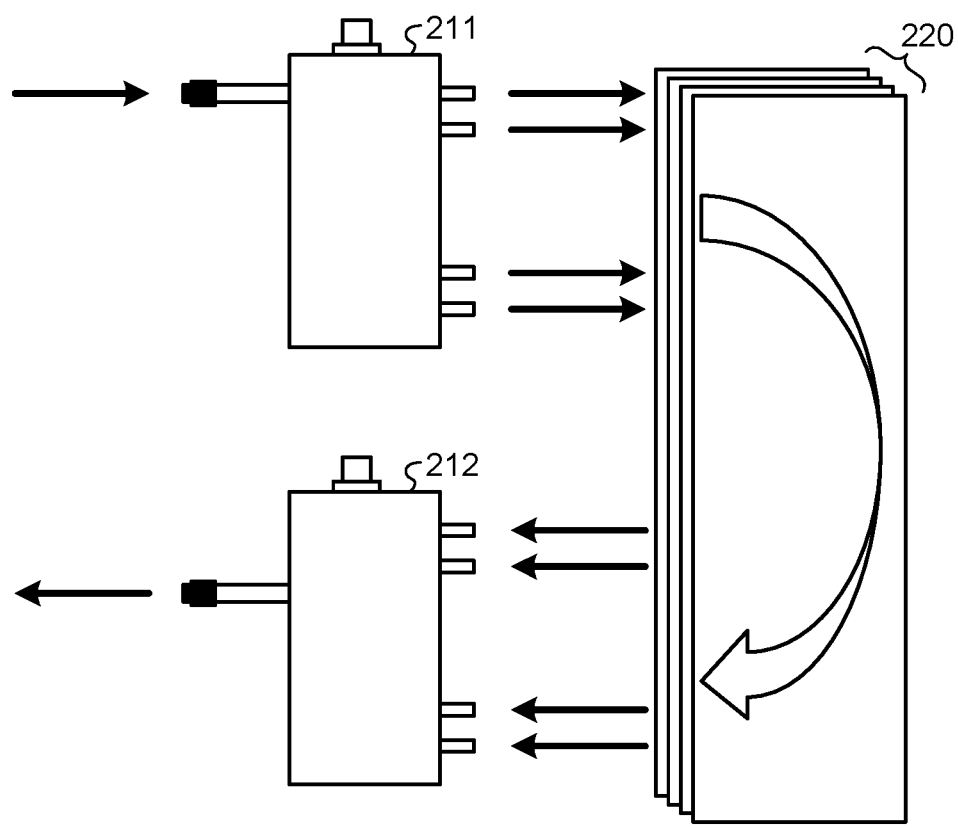
FIG. 3 is a diagram illustrating a cooling method of indoor devices.

FIG. 3 is a diagram illustrating a cooling method of the indoor devices.

The server device 121 and the wireless control device 122 corresponding to the indoor devices include a plurality of substrates 220 on which heat-generating components are mounted. Metallic plate cooling members having channels for the secondary refrigerant in an interior portion of the plate cooling members are sandwiched between these substrates 220, and the surfaces of the plate cooling members come into contact with the substrates 220. The channels for the secondary refrigerant are evenly arranged around the entire area of the surface of each of the plate cooling members, and the entire surface of each of the plate cooling members is cooled by allowing the cooled secondary refrigerant to circulate through the interior portion. A supply purpose manifold 211 and a collection purpose manifold 212 are connected to the plate cooling members.

The secondary refrigerant sent from the pump unit 204 in the liquid cooling device 123 flows to the supply purpose manifold 211 via the hose and flows into the plate cooling members from the supply purpose manifold 211. Then, because the cooled secondary refrigerant circulates through the channels in the interior portion of the plate cooling member, each of the substrates 220 that sandwiches the plate cooling member is cooled. The secondary refrigerant flows out to the collection purpose manifold 212 from the plate cooling members and flows to the collection tank 201 in the liquid cooling device 123 via the hose.

In this way, because the substrates 220 in the indoor devices are cooled by the secondary refrigerant supplied from the liquid cooling device 123, it is possible to sufficiently cool the server device 121 and the wireless control device 122.

Figure 4:
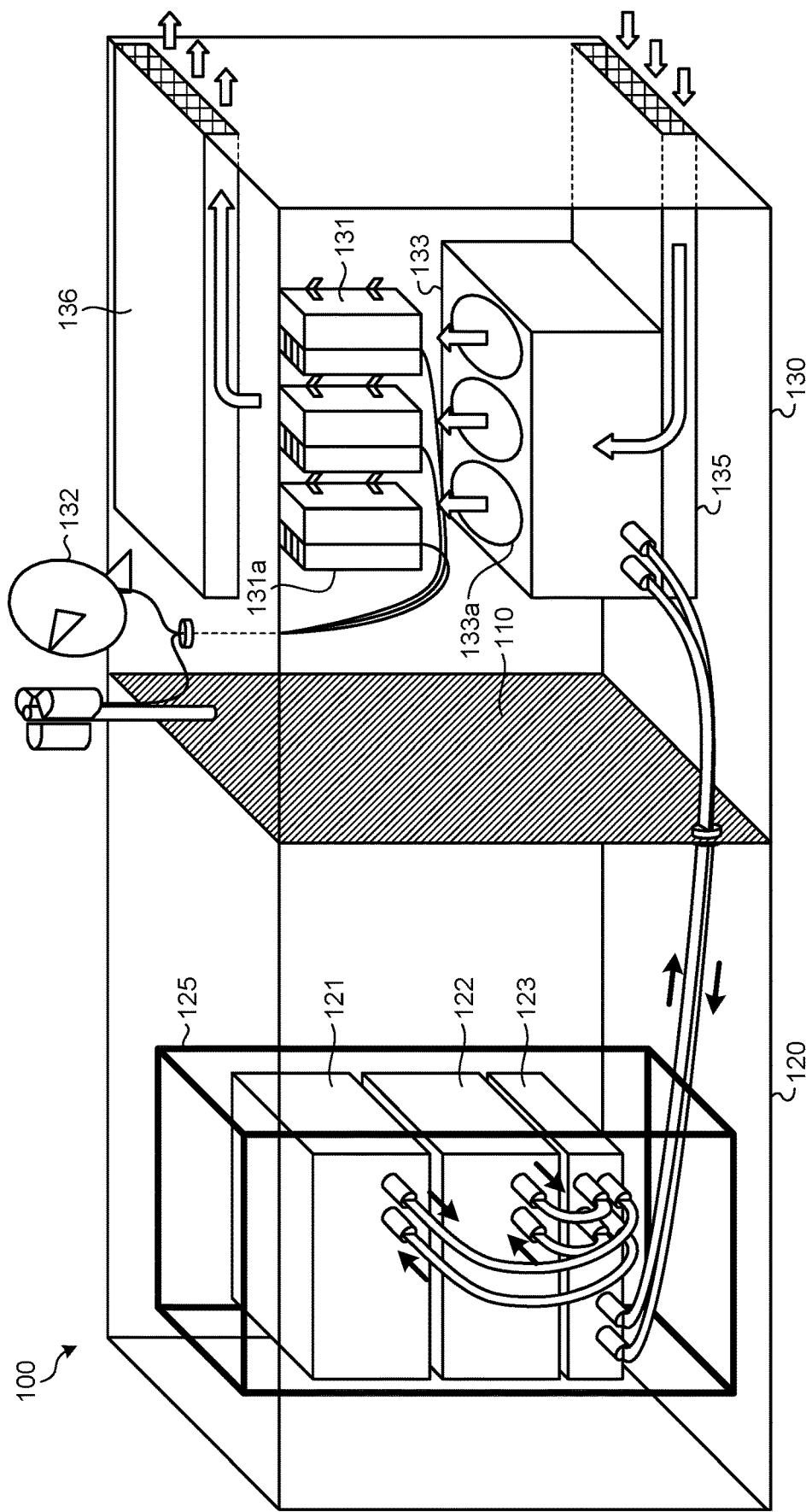
FIG. 4 is a diagram illustrating a specific configuration example of the base station.

FIG. 4 is a diagram illustrating a specific configuration example of the base station 100. In FIG. 4, components that are the same as those illustrated in FIG. 1 are assigned the same reference numerals.

As illustrated in FIG. 4, a shelf 125 is set up in the first area 120 that is partitioned by the partition wall 110, and the indoor devices and the liquid cooling device 123 are arranged in the shelf 125. Namely, the server device 121, the wireless control device 122, and the liquid cooling device 123 are arranged in the shelf 125 and each of the devices is connected by hoses serving as channels for the secondary refrigerant. In FIG. 4, the direction in which the primary refrigerant or the secondary refrigerant flows is indicated by the black arrow.

The first area 120 and the second area 130 are partitioned by the partition wall 110 in the closed space and airtightness is maintained at a certain level. Consequently, outside air is not brought into contact with the server device 121 and the wireless control device 122 arranged in the first area 120, and it is possible to prevent the server device 121 and the wireless control device 122 from being damaged due to, for example, dust or moisture. Furthermore, the server device 121 and the wireless control device 122 generate heat by consuming electrical power consumption; however, each of the devices is intensively cooled by the secondary refrigerant supplied from the liquid cooling device 123. Therefore, it is possible to efficiently cool the indoor devices. At this time, because cooling is not performed by using, for example, an air cooling device, such as air conditioner, it is possible to reduce noise.

The liquid cooling device 123 is connected, by the hoses, to the radiator 133 arranged in a separated area of the second area 130 partitioned by the partition wall 110. These hoses pass through a through-hole on the partition wall 110; however, the circumference of the hoses in the through-hole is sealed by, for example, packing. Therefore, it is possible to secure airtightness of the first area 120.

The second area 130 includes an air intake duct 135 and an exhaust air duct 136 and outside air circulation is possible in this area. In FIG. 4, a flowing direction of air is indicated by the white arrow.

The radiator 133 introduces outside air from the air intake duct 135 and temporarily cools the refrigerant by performing heat exchange with air. At this time, the radiator 133 forms a flow of air by the fan and discharges the air that has been used to cool the primary refrigerant from opening units 133a arranged on the upper surface. Accordingly, the radiator 133 sends air from the opening units 133a to an upper part.

The wireless device 131 connected to the antenna 132 that is arranged outside is arranged above the opening units 133a of the radiator 133. Namely, the wireless device 131 is arranged at the position that is opposite the opening units 133a of the radiator 133 and that receives the air from the radiator 133. The wireless device 131 includes radiating fins 131a. Heat generated in a circuit in the wireless device 131 is conducted to the radiating fins 131a and radiated from the radiating fins 131a. The radiating fins 131a extend along the blowing direction from the radiator 133 and air discharged from the radiator 133 passes between the plurality of the radiating fins 131a. Consequently, the radiating fins 131a can efficiently radiate the heat generated in the wireless device 131.

The air passing between the radiating fins 131a included in the wireless device 131 is discharged from the exhaust air duct 136 to the exterior portion of the base station 100. Consequently, the air discharged from the radiator 133 is used to radiate the wireless device 131 and then discharged to the exterior portion. As a result, it is possible to sufficiently cool the wireless device 131.

As described above, according to the embodiment, by dividing closed space into two areas by using the partition wall, and by arranging the indoor devices in one of the areas in which airtightness is secured, the indoor devices are cooled by the liquid cooling system. Furthermore, by arranging the wireless device and the radiator that is used to cool the refrigerant and that is used in the liquid cooling system in the other one of the areas, heat generated in the wireless device is radiated by air discharged from the radiator. Consequently, it is possible to intensively cool the indoor devices, such as the server device, the wireless control device, and the like, in the liquid cooling system, and it is also possible to cool the wireless device by sending air from the radiator. In other words, it is possible to sufficiently cool the devices constituting the base station.

Furthermore, when compared with an air cooling system that cools the entire space in which devices are arranged, by using the liquid cooling system that directly cools the devices by circulating the refrigerant, it is possible to efficiently cool the devices and reduce an amount of electrical power consumption of cooling. As a result, if, for example, a generator that has a limited supply of electrical energy is used for a power supply of the base station, it is possible to supply a larger amount of electrical power to the server device, the wireless control device, and the wireless device, and it is thus possible to extend the hours of operation as the base station.

Figure 5:
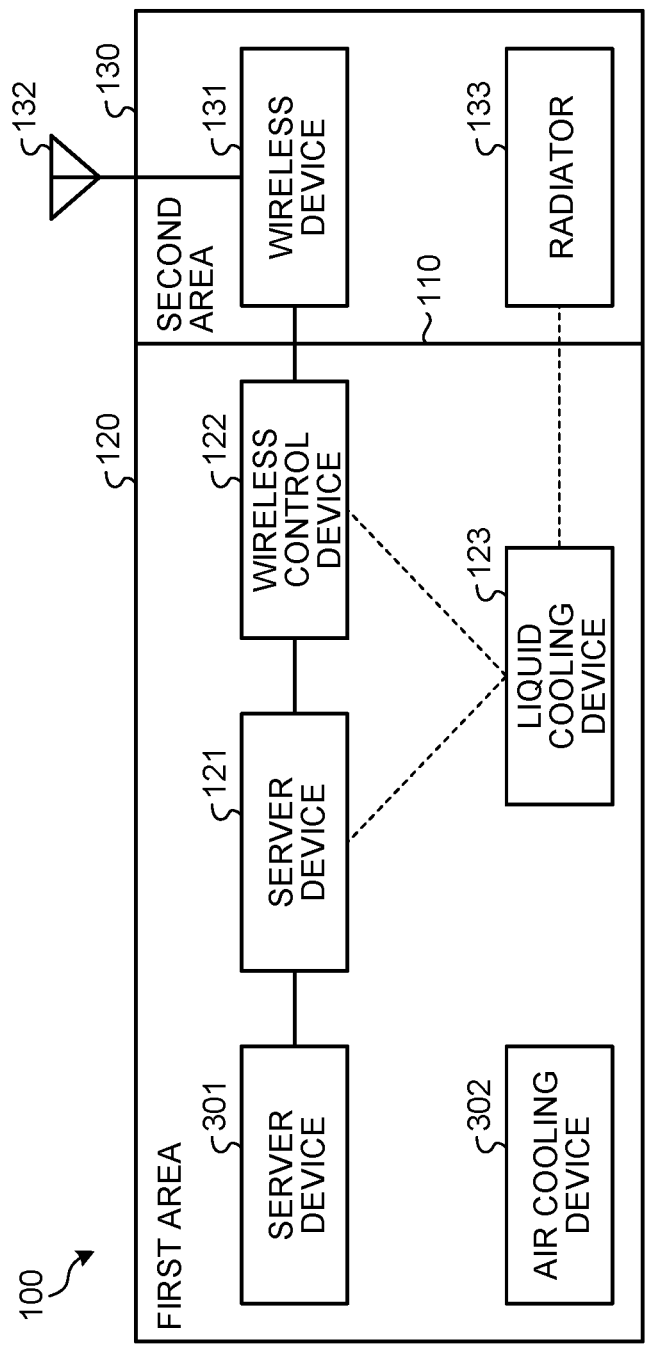
FIG. 5 is a block diagram illustrating a modification of the base station.

Furthermore, in the embodiment described above, it is assumed that the indoor devices arranged in the first area 120 are cooled by the secondary refrigerant supplied from the liquid cooling device 123; however, the indoor devices cooled by the air cooling system may also be arranged in the first area 120. Namely, for example, as illustrated in FIG. 5, a server device 301 may also be arranged in the first area 120 and the server device 301 may also be cooled by an air cooling device 302, such as an air conditioner.

Even in this case, because the server device 121 and the wireless control device 122 are cooled by the liquid cooling system, it is possible to concentrate the cooling capacity of the air cooling device 302 on cooling the server device 301, and efficient cooling is possible when compared with a case in which the entire region of the first area 120 is cooled by the air cooling system.

Furthermore, in the embodiment described above, the wireless device 131 is assumed to be arranged at the position where the wireless device 131 receives air sent from the radiator 133; however, the positional relationship between the radiator 133 and the wireless device 131 is not limited to this. Because air circulation occurs in the second area 130 due to air sent from the radiator 133 and a windless state does not occur in this area, it is possible to radiate heat generated in the wireless device 131 even if the wireless device 131 is not arranged at the position where the wireless device 131 directly receives air sent from the radiator 133.

Furthermore, in the embodiment described above, the secondary refrigerant is assumed to be used to cool the indoor devices and the primary refrigerant is assumed to be used to cool the secondary refrigerant; however, the refrigerant for cooling the indoor devices may also directly be cooled by the radiator. In this case, in the configuration of the liquid cooling device 123 illustrated in FIG. 2, the heat exchanger 202 may also be eliminated. Then, the refrigerant collected by the collection tank 201 is sent to the radiator 133, cooled by the radiator 133, and then sent to the distribution tank 203 in the liquid cooling device 123. By doing so, it is possible to simplify the structure and reduce the size of the liquid cooling device 123.

According to an aspect of an embodiment of the base station and the device cooling method disclosed in the present invention, an advantage is provided in that it is possible to sufficiently cool the devices.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A base station comprising:
a first area; and
a second area, the first area and the second area being obtained by partitioning closed space by a partition wall, wherein
the first area includes
a first device that controls communication, and
a liquid cooling device that sends, to the first device, a first liquid refrigerant to cool the first device, and
the second area includes
a radiator that cools a second liquid refrigerant by performing heat exchange with air, that supplies the second liquid refrigerant to the liquid cooling device, and that discharges the air used for the heat exchange into the second area, and
a second device that radiates heat by using the air discharged from the radiator and that transmits and receives a signal using an antenna in accordance with control performed by the first device.

2. The base station according to claim 1, wherein
the radiator includes an opening that discharges the air into the second area, and
the second device is arranged at a position opposite the opening.

3. The base station according to claim 1, wherein the liquid cooling device includes
a heat exchanger that cools, by performing heat exchange between the first liquid refrigerant and the second liquid refrigerant, the first liquid refrigerant, and
a sending unit that sends the first liquid refrigerant cooled by the heat exchanger to the first device, and
the radiator cools the second liquid refrigerant by performing heat exchange with air and supplies the cooled second liquid refrigerant to the heat exchanger.

4. The base station according to claim 1, wherein
the first device includes
a substrate on which a heat-generating component is mounted, and
a plate cooling member that contacts with the substrate and inside which the cooled liquid refrigerant sent from the liquid cooling device is circulated through.

5. A device cooling method comprising:
cooling, by a liquid refrigerant, a first device that controls communication and that is arranged in a first area in a closed space, the closed space being partitioned into the first area and a second area by a partition wall;
sending the liquid refrigerant used to cool the first device to a radiator that is arranged in the second area;
cooling, in the radiator, the liquid refrigerant by performing heat exchange with air and discharging the air used for the heat exchange into the second area; and
causing a second device arranged in the second area to radiate heat by using the air discharged into the second area, the second device transmitting and receiving a signal using an antenna in accordance with control performed by the first device.

6. The base station according to claim 1, wherein
the radiator receives the first liquid refrigerant sent from the liquid cooling device as the second liquid refrigerant, cools the second liquid refrigerant by performing heat exchange with air and supplies the cooled second liquid refrigerant to the liquid cooling device as the first liquid refrigerant.

* * * * *